US012787381B2

(12) United States Patent
Park et al.

(10) Patent No.: US 12,787,381 B2
(45) Date of Patent: Nov. 3, 2026

(54) SEMICONDUCTOR DEVICES

(71) Applicant: SAMSUNG ELECTRONICS CO., LTD., Suwon-si (KR)

(72) Inventors: Junbeom Park, Suwon-si (KR); Sangwon Baek, Suwon-si (KR); Yunsuk Nam, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 507 days.

(21) Appl. No.: 18/204,449

(22) Filed: Jun. 1, 2023

(65) Prior Publication Data

US 2024/0006522 A1 Jan. 4, 2024

(30) Foreign Application Priority Data

Jul. 4, 2022 (KR) ........................ 10-2022-0081896

(51) Int. Cl.
*H01L 29/775* (2006.01)
*H01L 29/06* (2006.01)
(Continued)

(52) U.S. Cl.
CPC ....... *H10D 62/121* (2025.01); *H10D 30/0195* (2025.01); *H10D 30/507* (2025.01);
(Continued)

(58) Field of Classification Search
CPC ....... H10D 30/507–509; H10D 64/018; H10D 62/121
See application file for complete search history.

(56) References Cited

U.S. PATENT DOCUMENTS 9,647,124 B2 5/2017 Alptekin et al.
9,947,804 B1 * 4/2018 Frougier ............ H10D 30/6743
(Continued)

FOREIGN PATENT DOCUMENTS

EP 4009377 A1 6/2022
EP 4020586 A1 6/2022
KR 10-2007-0035731 A 4/2007

OTHER PUBLICATIONS

Partial Search Report issued Dec. 13, 2023 by the European Patent Office for corresponding patent application EP 23183306.2.

*Primary Examiner* — Victoria K. Hall
(74) *Attorney, Agent, or Firm* — Muir Patent Law, PLLC

(57) ABSTRACT

A semiconductor device includes an active region extending in a first direction on a substrate; a plurality of channel layers on the active region and spaced apart from each other in a vertical direction that is perpendicular to the first direction; a gate structure on the substrate, the gate structure intersecting the active region and the plurality of channel layers, extending in a second direction crossing the first direction, and respectively surrounding the plurality of channel layers; inner spacer layers on both sides of the gate structure in the first direction, and on respective lower surfaces of the plurality of channel layers; a protective layer in contact with the inner spacer layers, the plurality of channel layers, and the active region; and a source/drain region on the active region, on at least one side of the gate structure, and in contact with the inner spacer layers.

20 Claims, 26 Drawing Sheets

A

(51) Int. Cl.

| | |
|---|---|
| ***H01L 29/417*** | (2006.01) |
| ***H01L 29/423*** | (2006.01) |
| ***H01L 29/66*** | (2006.01) |
| ***H10D 30/00*** | (2025.01) |
| ***H10D 30/01*** | (2025.01) |
| ***H10D 30/67*** | (2025.01) |
| ***H10D 62/10*** | (2025.01) |
| ***H10D 64/01*** | (2025.01) |

(52) U.S. Cl.
CPC ..... *H10D 30/6729* (2025.01); *H10D 30/6735* (2025.01); *H10D 64/017* (2025.01); *H10D 64/018* (2025.01)

(56) References Cited

U.S. PATENT DOCUMENTS

| | | | |
|---|---|---|---|
| 10,263,100 B1 | 4/2019 | Bi et al. | |
| 10,388,732 B1 | 8/2019 | Frougier et al. | |
| 10,403,738 B1 | 9/2019 | Sung et al. | |
| 10,679,906 B2 | 6/2020 | Cheng et al. | |
| 10,832,907 B2 | 11/2020 | Cheng et al. | |
| 11,069,819 B2 | 7/2021 | Frougier | |
| 2007/0072431 A1 | 3/2007 | Mun et al. | |
| 2019/0371917 A1 | 12/2019 | Lee et al. | |
| 2021/0280486 A1 | 9/2021 | Peng et al. | |
| 2021/0336034 A1 | 10/2021 | Wu et al. | |
| 2021/0408288 A1 | 12/2021 | O'Brien et al. | |
| 2022/0199783 A1 | 6/2022 | Penumatcha et al. | |
| 2023/0335600 A1* | 10/2023 | Cheng ................ | H10D 30/6757 |

* cited by examiner

SEMICONDUCTOR DEVICES

CROSS-REFERENCE TO RELATED APPLICATION(S)

This application claims the benefit under 35 U.S.C. § 119 to Korean Patent Application No. 10-2022-0081896 filed on Jul. 4, 2022, in the Korean Intellectual Property Office, the disclosure of which is incorporated herein by reference in its entirety.

BACKGROUND

1. Field

Embodiments relate to semiconductor devices.

2. Description of the Related Art

As demand for high performance, high speed, and/or multifunctionality of semiconductor devices increases, the degree of integration thereof may be increasing. In manufacturing a semiconductor device having a fine pattern corresponding to the trend for high integration of semiconductor devices, patterns having a fine width or a fine separation distance may be implemented. In addition, in order to reduce the limitation of operating characteristics due to the size reduction of planar metal oxide semiconductor FET (MOSFET), efforts are being made to develop a semiconductor device including a FinFET having a three-dimensional structure channel.

SUMMARY

The embodiments may be realized by providing a semiconductor device including a substrate; an active region extending in a first direction on the substrate; a plurality of channel layers on the active region, the plurality of channel layers being spaced apart from each other in a vertical direction that is perpendicular to the first direction; a gate structure on the substrate, the gate structure intersecting the active region and the plurality of channel layers, extending in a second direction crossing the first direction, and respectively surrounding the plurality of channel layers; inner spacer layers on both sides of the gate structure in the first direction, and on respective lower surfaces of the plurality of channel layers; a protective layer in contact with the inner spacer layers, the plurality of channel layers, and the active region; and a source/drain region on the active region, on at least one side of the gate structure, and in contact with the inner spacer layers.

The embodiments may be realized by providing a semiconductor device including a substrate; an active region extending in a first direction on the substrate; a plurality of channel layers on the active region, the plurality of channel layers being spaced apart from each other in a vertical direction that is perpendicular to the first direction; a gate structure on the substrate, the gate structure intersecting the active region and the plurality of channel layers, extending in a second direction that crosses the first direction, and surrounding the plurality of channel layers, respectively; inner spacer layers on both sides of the gate structure in the first direction, and on respective lower surfaces of the plurality of channel layers; a conductive protective layer in contact with the inner spacer layers and the plurality of channel layers; and a source/drain region on the active region, on at least one side of the gate structure, and in contact with the inner spacer layers, wherein the conductive protective layer is between the plurality of channel layers and the source/drain regions, and wherein the conductive protective layer includes a conductive material.

The embodiments may be realized by providing a semiconductor device including a substrate; an active region extending in a first direction on the substrate; a plurality of channel layers on the active region, the plurality of channel layers being spaced apart from each other in a vertical direction that is perpendicular to the first direction; a gate structure on the substrate, the gate structure extending in a second direction that crosses the first direction, intersecting the active region and the plurality of channel layers, and respectively surrounding the plurality of channel layers; an insulating protective layer between the plurality of channel layers and the gate structure and between the active region and the plurality of channel layers; and a source/drain region on the active region on at least one side of the gate structure, and in contact with the plurality of channel layers, wherein the insulating protective layer covers respective lower surfaces of the plurality of channel layers, and wherein the insulating protective layer covers an upper surface of a portion of the plurality of channel layers.

BRIEF DESCRIPTION OF DRAWINGS

Features will be apparent to those of skill in the art by describing in detail exemplary embodiments with reference to the attached drawings in which.

DETAILED DESCRIPTION

Figure 1:
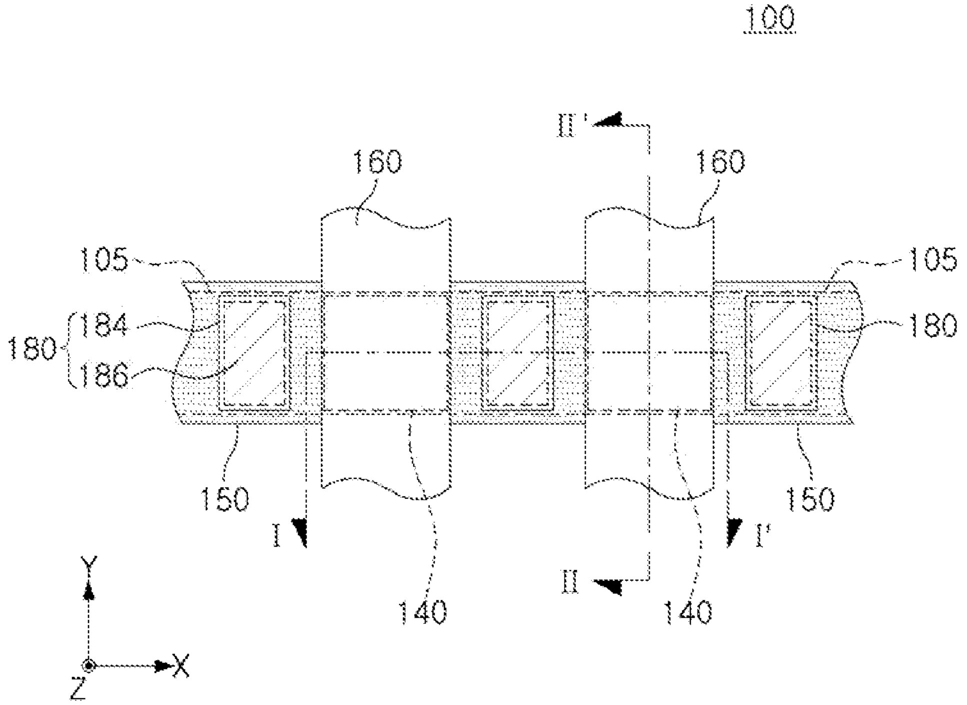
FIG. 1 is a plan view illustrating a semiconductor device according to example embodiments.

FIG. 1 is a plan view illustrating a semiconductor device according to example embodiments.

Figure 2A:
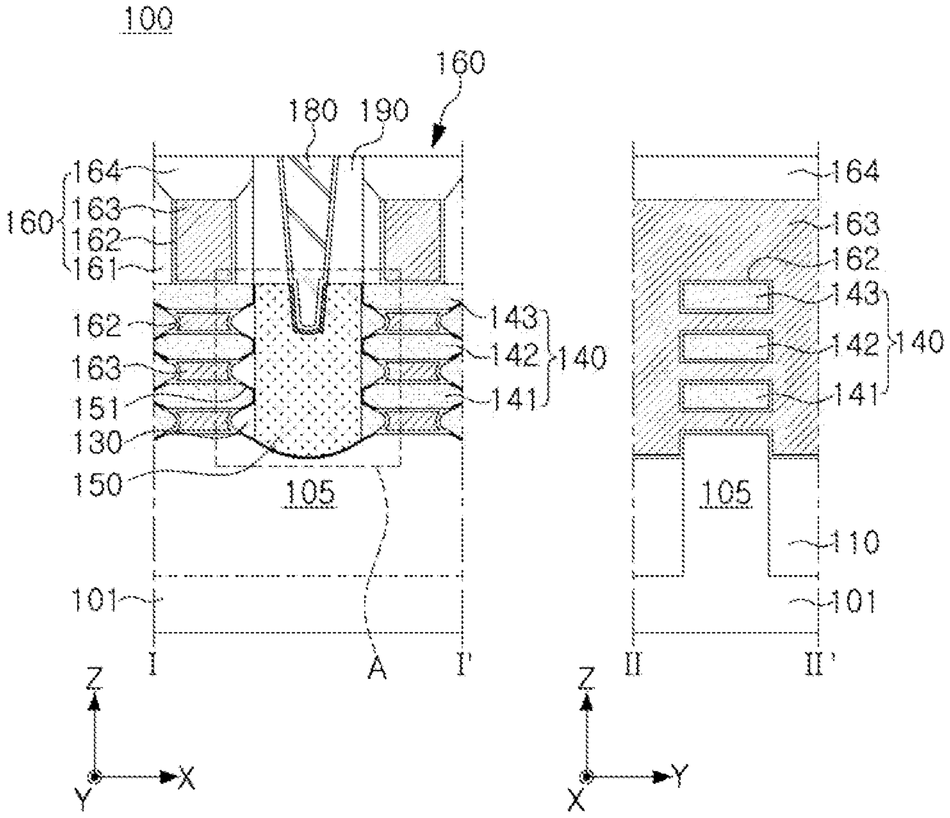
FIG. 2A is a cross-sectional view illustrating a semiconductor device according to example embodiments.

FIG. 2A is a cross-sectional view illustrating a semiconductor device according to example embodiments. FIG. 2A illustrates cross-sections of the semiconductor device of FIG. 1 taken along lines I-I' and respectively.

Figure 2B:
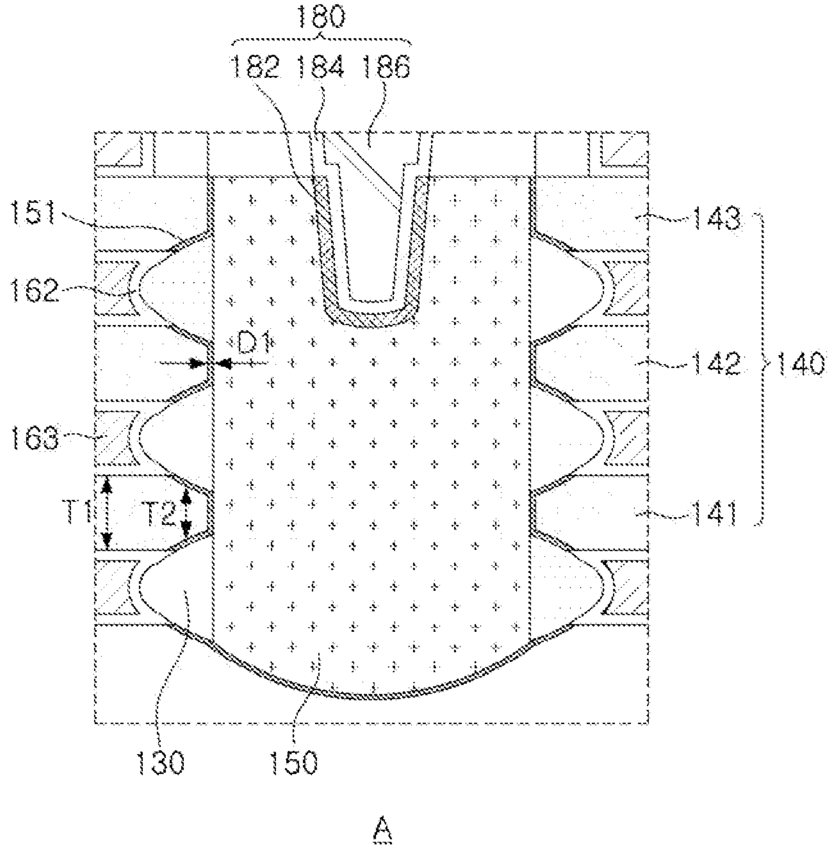
FIG. 2B is a partially enlarged view illustrating a portion of a semiconductor device according to example embodiments.

FIG. 2B is a partially enlarged view illustrating a partial region of a semiconductor device according to example embodiments. FIG. 2B illustrates an enlarged area 'A' of FIG. 2A.

For convenience of description, only major components of the semiconductor device are illustrated in FIGS. 1 to 2B.

Referring to FIGS. 1 to 2B, a semiconductor device 100 may include a substrate 101, an active region 105 on the substrate 101, a channel structure 140 including a plurality of channel layers 141, 142 and 143 that are vertically spaced apart from each other on the active region 105 (e.g., in a vertical Z direction that is perpendicular to horizontal first X and second Y directions that are parallel to an upper surface of the substrate 101), a source/drain region 150 in contact with or adjacent to the plurality of channel layers 141, 142, and 143, inner spacer layers 130 on both sides of the gate structure in a first direction (horizontal X direction) and on respective lower surfaces of (e.g., outer sides of) the plurality of channel layers, a conductive protective layer 151 between the inner spacer layers 130 and the plurality of channel layers 141, 142 and 143, e.g., at a boundary portion therebetween, a gate structure 160 extending (e.g., lengthwise) while intersecting the active region 105, and a contact plug 180 connected to the source/drain region 150. The semiconductor device 100 may further include device isolation layers 110 and an interlayer insulating layer 190. The gate structure 160 may include, e.g., spacer layers 161, a gate dielectric layer 162, a gate electrode layer 163, and a gate capping layer 164.

In the semiconductor device 100, the active region 105 may have a fin structure, and the gate electrode layer 163 may be between the active region 105 and the channel structure 140, and between the plurality of channel layers 141, 142 and 143 of the channel structures 140, e.g., on the channel structure 140. In an implementation, the semiconductor device 100 may include a gate-all-around type field effect transistor formed by the channel structure 140, the source/drain region 150, and the gate structure 160, e.g., a Multi Bridge Channel FET (MBCFET™). The transistor may be, e.g., PMOS transistors.

The substrate 101 may have an upper surface extending in the X-direction and the Y-direction (e.g., in a X-Y plane). The substrate 101 may include a semiconductor material, e.g., a group IV semiconductor, a group III-V compound semiconductor, or a group II-VI compound semiconductor. In an implementation, the group IV semiconductor may include, e.g., silicon, germanium, or silicon-germanium. The substrate 101 may be, e.g., a bulk wafer, an epitaxial layer, a silicon on insulator (SOI) layer, a semiconductor on insulator (SeOI) layer, or the like. As used herein, the term "or" is not an exclusive term, e.g., "A or B" would include A, B, or A and B.

The device isolation layer 110 may define the active region 105 in the substrate 101. The device isolation layer 110 may be formed by, e.g., a shallow trench isolation (STI) process. In an implementation, the device isolation layer 110 may further include a region having a step below the substrate 101 and extending more deeply. The device isolation layer 110 may partially expose an upper portion of the active region 105. In an implementation, the device isolation layer 110 may have a curved upper surface having a higher level as it approaches the active region 105. The device isolation layer 110 may be formed of an insulating material. The device isolation layer 110 may include, e.g., an oxide, a nitride, or a combination thereof.

The active region 105 may be defined by the device isolation layer 110 in the substrate 101 and may extend (e.g., lengthwise) in the first direction, e.g., the X direction. The active region 105 may have a structure protruding from the substrate 101. The upper end of the active region 105 may protrude to a predetermined height (e.g., in the Z direction) from or above the upper surface of the device isolation layer 110. The active region 105 may be formed as a portion of the substrate 101, or may include an epitaxial layer grown from the substrate 101. In an implementation, on both sides of the gate structure 160, the active region 105 on the substrate 101 may be partially recessed, and the source/drain regions 150 may be on the recessed active region 105. The active region 105 may include impurities or may include doped regions containing impurities.

The channel structure 140 may include the first to third channel layers 141, 142 and 143 that are two or more, e.g., a plurality of channel layers spaced apart from each other in the direction perpendicular to the upper surface of the active region 105 or the substrate 101, e.g., in the Z direction, on the active region 105. The first to third channel layers 141, 142, and 143 may be spaced apart from the upper surface of the active region 105 and may be (e.g., electrically) connected to the source/drain region 150. In an implementation, the first to third channel layers 141, 142, and 143 may have the same or similar width as the active region 105 in the Y direction, and may have the same or similar width as the gate structure 160 in the X direction. In an implementation, the first to third channel layers 141, 142, and 143 may have a reduced width in the X direction such that side surfaces are under the gate structure 160. In an implementation, a width (e.g., vertical height) of each the plurality of channel layers 141, 142, and 143 in the vertical direction may include a width T1 of a portion in the vertical direction (from which a portion of the plurality of channel layers 141, 142, and 143 is not removed or otherwise reduced), and a width T2 of a portion in the vertical direction (from which a portion of the plurality of channel layers 141, 142, and 143 has been removed or reduced). In an implementation, the portion having the width T1 may be adjacent to the portion having the width T2 in the X direction. A width of the plurality of channel layers 141, 142, and 143 as measured in the vertical Z direction may decrease, toward the source/drain region 150. In an implementation, the width T2 (in the vertical Z direction) of the portion from which at least a part of the plurality of channel layers 141, 142, and 143 have been removed, may be less than the width T1 (in the vertical Z direction) of the portion from which a part of the plurality of channel layers 141, 142, and 143 have not been removed. In an implementation, a contact area between the source/drain region 150 and the plurality of channel layers 141, 142, and 143 may be reduced.

The first to third channel layers 141, 142, and 143 may be formed of a semiconductor material, e.g., silicon (Si), silicon germanium (SiGe), or germanium (Ge). The first to third channel layers 141, 142, and 143 may be formed of, e.g., the same material as a material of the substrate 101. In an implementation, a number and shape of the plurality of channel layers 141, 142, and 143 constituting one channel structure 140 may be variously changed. In an implementation, the channel structure 140 may further include a channel layer on the upper surface of the active region 105.

The source/drain regions 150 may be on the active region 105 at both sides of the channel structure 140. The source/drain region 150 may serve as a source region or a drain region of the transistor. In an implementation, the source/drain region 150 may be formed by partially recessing an upper portion of the active region 105, or the presence or absence of the recess and the depth of the recess may be variously changed. The source/drain region 150 may include epitaxial layers along side surfaces of the first to third channel layers 141, 142, and 143 of the channel structure 140. In an implementation, the source/drain region 150 may include a plurality of epitaxial layers. The source/drain region 150 may be a semiconductor layer including, e.g., silicon (Si) or germanium (SiGe). The source/drain regions 150 may include impurities of different types and/or concentrations. In an implementation, the source/drain region 150 may include, e.g., N-type doped silicon (Si) or P-type doped silicon germanium (SiGe). In an implementation, the source/drain region 150 may include a plurality of regions including different concentrations of an element and/or a doping element. In an implementation, the source/drain region 150 may have a circular, elliptical, pentagonal, hexagonal, or similar shape in cross section in the Y direction. In an implementation, the source/drain region 150 may have various shapes, e.g., a polygonal shape, a circular shape, or a rectangular shape.

The inner spacer layers 130 may be parallel with the gate electrode layer 163, between the channel structures 140. Below the third channel layer 143, the gate electrode layer 163 may be spaced apart from the source/drain region 150 by the inner spacer layers 130, e.g., such that the gate electrode layer 163 may be electrically isolated from the source/drain region 150. In an implementation, the inner spacer layers 130 may have a shape in which a side surface facing the gate electrode layer 163 is convexly rounded inwardly toward the gate electrode layer 163. In an implementation, the inner spacer layers 130 may be formed of or include an oxide, a nitride, or an oxynitride, e.g., a low-K film.

In an implementation, the inner spacer layers 130 may be formed of the same material as the spacer layers 161. In an implementation, the inner spacer layers 130 may include, e.g., SiN, SiCN, SiOCN, SiBCN, or SiBN. The inner spacer layers 130 may also be applied to other embodiments.

The conductive protective layer 151 may contact the active region 105, the inner spacer layers 130, and the plurality of channel layers 141, 142, and 143. The conductive protective layer 151 may surround a recess region RC (refer to FIG. 9E) before the source/drain region 150 is formed. The conductive protective layer 151 may be conformally formed. A thickness D1 of the conductive protective layer 151 may be, e.g., about 0.3 nm to about 1.0 nm. The conductive protective layer 151 may be at a boundary portion between the plurality of channel layers 141, 142, and 143 and the inner spacer layers 130, at a boundary portion between the active region 105 and the source/drain region 150, and at a boundary portion between the plurality of channel layers 141, 142, and 143 and the source/drain region 150. In the cross-section in or along the X-direction, the lowermost portion of the source/drain region 150 may be at a lower level than the lowermost level of the gate structure 160, and thus, a lowermost portion of the conductive protective layer 151 surrounding a portion of the source/drain region 150 may be on a level lower than the lowermost level of the gate structure 160.

The conductive protective layer 151 may be formed of or include, e.g., a two-dimensional (2D) material. In an implementation, the 2D material may include, e.g., conductive graphene, phosphine-functionalized graphene oxide (GO-$PPh_2$), $MoS_2$, $WS_2$, $MoSe_2$, $WSe_2$, $MoTe_2$, $WTe_2$, $ZrS_2$, $ZrSe_2$, $TiS_3$, $TiSe_3$, $ZrS_3$, $ZrSe_3$, $MnPS_3$, $FePS_3$, $CoPS_3$, $NiPS_3$, GaS, GaSe, $RuO_2$, black phosphorus, or phosphorene. In an implementation, the conductive protective layer 151 of FIG. 2A may include, e.g., graphene.

The conductive protective layer 151 may be distinguished from the active region 105, the inner spacer layers 130, the plurality of channel layers 141, 142 and 143, and the source/drain region 150 on an electron micrograph. The conductive protective layer 151 may have or include a material and components from the active region 105, the inner spacer layers 130, the plurality of channel layers 141, 142 and 143, and the source/drain region 150.

The gate structure 160 may be on the upper portions of the active region 105 and on the channel structures 140 to intersect the active region 105 and the channel structures 140, e.g., may extend lengthwise in the Y direction. Channel regions of transistors may be in the active region 105 and in the channel structures 140 intersecting the gate structure 160. The gate structure 160 may include a gate electrode layer 163, a gate dielectric layer 162 between the gate electrode layer 163 and the plurality of channel layers 141, 142, and 143, and spacer layers 161 on side surfaces of the gate electrode layer 163, and a gate capping layer 164 on the upper surface of the gate electrode layer 163.

The gate dielectric layer 162 may be between the active region 105 and the gate electrode layer 163 and between the channel structure 140 and the gate electrode layer 163, and may cover at least a portion of the surfaces of the gate electrode layer 163. In an implementation, the gate dielectric layer 162 may surround all surfaces except for an uppermost surface of the gate electrode layer 163. In an implementation, the gate dielectric layer 162 may extend between the gate electrode layer 163 and the spacer layers 161. The gate dielectric layer 162 may include, e.g., an oxide, nitride, or a high-K material. The high-K material may refer to a dielectric material having a higher dielectric constant than a dielectric constant of a silicon oxide layer ($SiO_2$). In an implementation, the high-K material may include, e.g., aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$).

The gate electrode layer 163 may be on the active region 105, may fill a space between the plurality of channel layers 141, 142, and 143, and may extend to or on an upper portion of the channel structure 140. The gate electrode layer 163 may be spaced apart from the plurality of channel layers 141, 142, and 143 by the gate dielectric layer 162. The gate electrode layer 163 may include a conductive material. In an implementation, the gate electrode layer 163 may include, e.g., a metal nitride such as titanium nitride (TiN), tantalum nitride (TaN), or tungsten nitride (WN), and/or a metal material such as aluminum (Al), tungsten (W) or molybdenum (Mo), or a semiconductor material such as doped polysilicon.

In an implementation, the gate electrode layer 163 may be formed of two or more multi-layers. The spacer layers 161 may be on both side surfaces of the gate electrode layer 163. The spacer layers 161 may insulate the source/drain region

150 from the gate electrode layer 163. In an implementation, the spacer layers 161 may have a multilayer structure. The spacer layers 161 may include, e.g., an oxide, a nitride, an oxynitride, or a low-K dielectric.

The gate capping layer 164 may be on the gate electrode layer 163. The gate capping layer 164 may extend in the second Y direction along the upper surface of the gate electrode layer 163. Side surfaces of the gate capping layer 164 may be surrounded by the spacer layers 161. In an implementation, the upper surface of the gate capping layer 164 may be substantially coplanar with the upper surface of the spacer layers 161. In an implementation, the gate capping layer 164 may include an oxide, a nitride, or oxynitride, e.g., SiO, SiN, SiCN, SiOC, SiON, or SiOCN.

The interlayer insulating layer 190 may cover the source/drain region 150, the gate structure 160, and the device isolation layer 110. The interlayer insulating layer 190 may include, e.g., an oxide, a nitride, an oxynitride, or a low-κ dielectric.

The contact plug 180 may penetrate at least a portion of the interlayer insulating layer 190 to contact the source/drain region 150, and may apply an electrical signal to the source/drain region 150. In an implementation, the contact plug 180 may be on the source/drain region 150, and may have a length longer in the Y-direction than the source/drain region 150. In an implementation, the contact plug 180 may have an inclined side such that a lower width is narrower than an upper width according to an aspect ratio. The contact plug 180 may penetrate into the source/drain region 150 to a predetermined depth. The contact plug 180 may include a metal-semiconductor compound layer 182 on a lower end, a barrier layer 184 along sidewalls, and a plug conductive layer 186. The metal-semiconductor compound layer 182 may include, e.g., a metal silicide layer. The barrier layer 184 may include, e.g., a metal nitride such as a titanium nitride layer (TiN), a tantalum nitride layer (TaN), or a tungsten nitride layer (WN). The plug conductive layer 186 may include, e.g., a metal material such as aluminum (Al), tungsten (W), or molybdenum (Mo). In an implementation, the contact plug 180 may pass through at least a portion of the source/drain region 150.

In an implementation, the conductive protective layer 151 may have the above-described structural characteristics, and a contact area between the source/drain region 150 and the plurality of channel layers 141, 142, and 143 may be increased. In an implementation, a semiconductor device having improved electrical characteristics by reducing resistance between the source/drain region 150 and the plurality of channel layers 141, 142, and 143 may be provided.

Figure 3A:
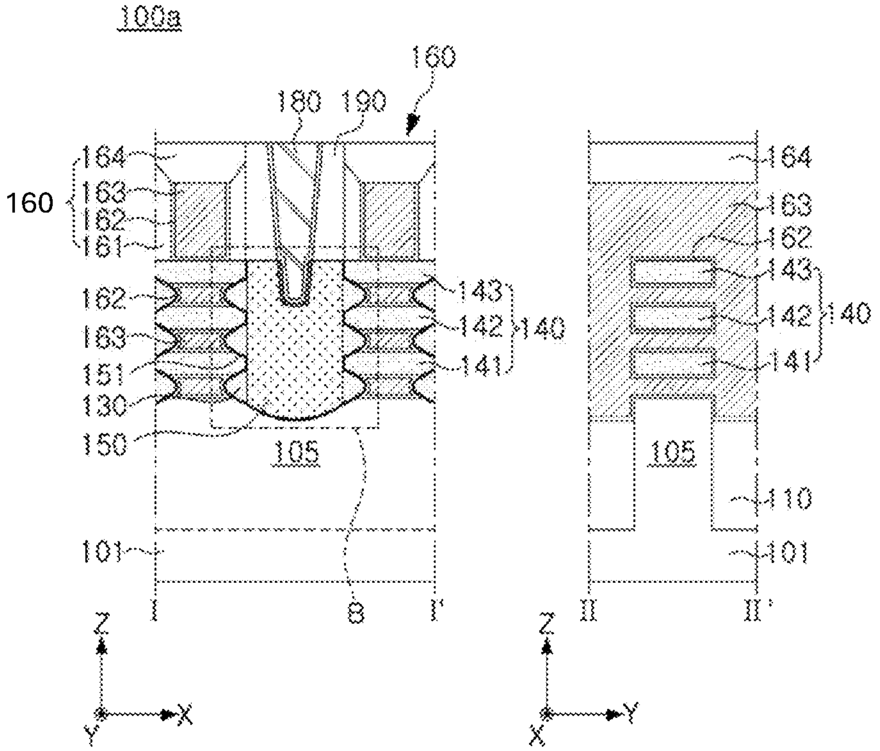
FIG. 3A is a cross-sectional view illustrating a semiconductor device according to example embodiments.

FIG. 3A is a cross-sectional view illustrating a semiconductor device 100*a* according to example embodiments.

Figure 3B:
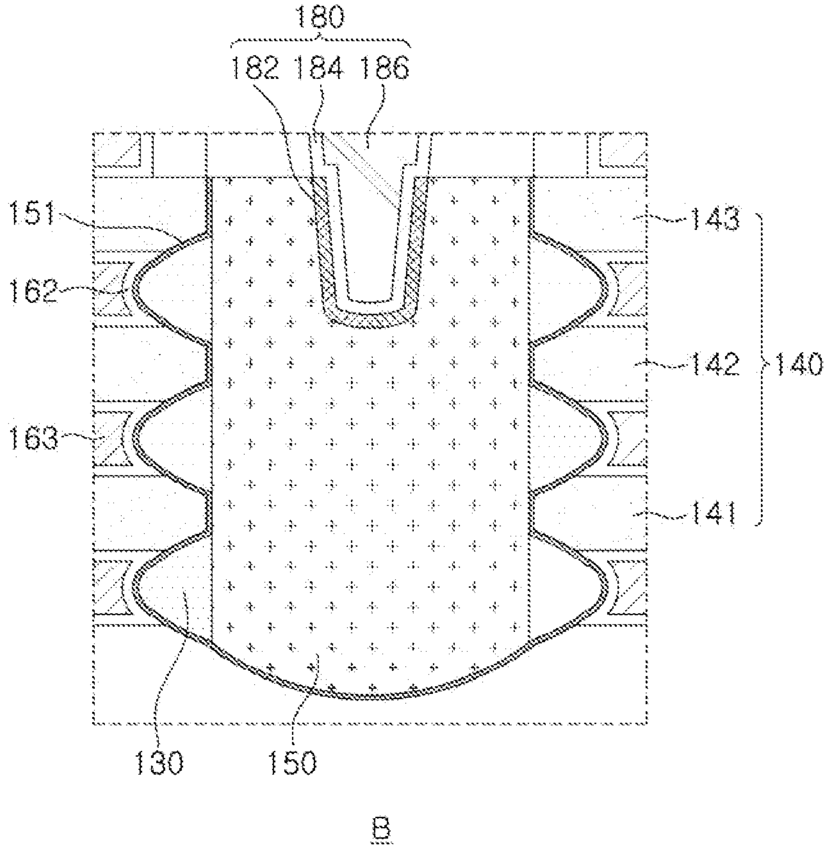
FIG. 3B is a partially enlarged view illustrating a portion of a semiconductor device according to example embodiments.

FIG. 3B is a partially enlarged view illustrating a portion of the semiconductor device 100*a* according to example embodiments. FIG. 3B illustrates an enlarged area 'B' of FIG. 3A.

In FIGS. 3A to 7, the same reference numerals as those of FIG. 2A indicate corresponding components, and a description overlapping with the above description may be omitted.

Referring to FIGS. 3A and 3B, the conductive protective layer 151 may surround an outer side surface and a lower surface of a region of the source/drain region 150 and the inner spacer layers 130. In manufacturing the semiconductor device 100*a*, the conductive protective layer 151 may not be removed in the process of removing the sacrificial layers 120 (see FIG. 9H), and thus, the conductive protective layer 151 may have this shape. In an implementation, the conductive protective layer 151 at the boundary portion between the active region 105 and the source/drain region 150 and the boundary portion between the plurality of channel layers 141, 142 and 143 and the source/drain region 150 may not be removed by a cleaning process or heat treatment before forming the source/drain region 150. In an implementation, a contact surface between the source/drain region 150 and the plurality of channel layers 141, 142, and 143 through the conductive protective layer 151 may be increased.

Figure 4A:
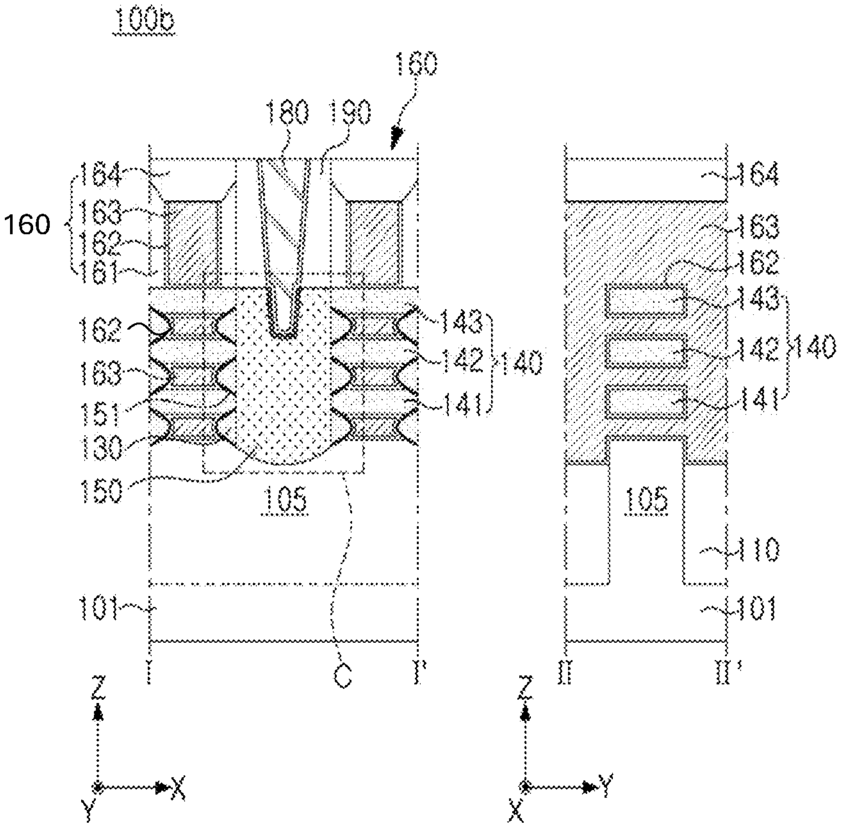
FIG. 4A is a cross-sectional view illustrating a semiconductor device according to example embodiments.

FIG. 4A is a cross-sectional view illustrating a semiconductor device 100*b* according to example embodiments.

Figure 4B:
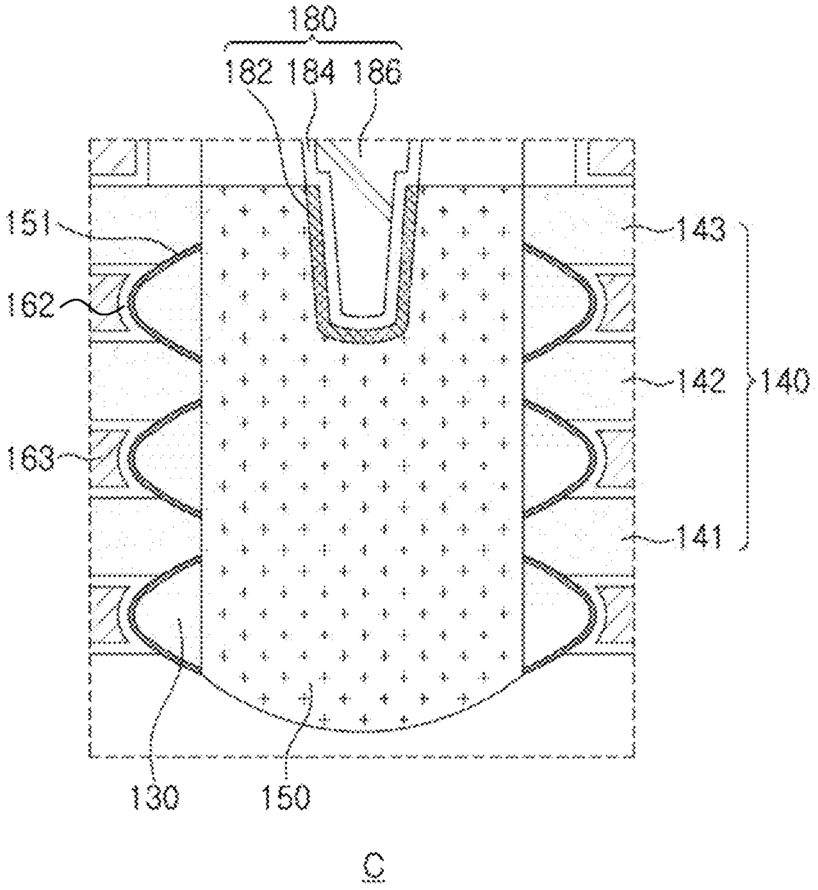
FIG. 4B is a partially enlarged view illustrating a portion of a semiconductor device according to example embodiments.

FIG. 4B is a partially enlarged view illustrating a portion of the semiconductor device 100*b* according to example embodiments. FIG. 4B illustrates an enlarged area 'C' of FIG. 4A.

Referring to FIGS. 4A and 4B, the conductive protective layer 151 may surround outer side surfaces of the inner spacer layers 130. When the semiconductor device 100*b* is manufactured, the conductive protective layer 151 may not be removed in the process of removing the sacrificial layers 120 (refer to FIG. 9H). The conductive protective layer 151 at the boundary portion between the active region 105 and the source/drain region 150 and the boundary portion between the plurality of channel layers 141, 142 and 143 and the source/drain region 150 may be removed by a cleaning process and heat treatment before forming the source/drain region 150, thereby having this shape.

Figure 5A:
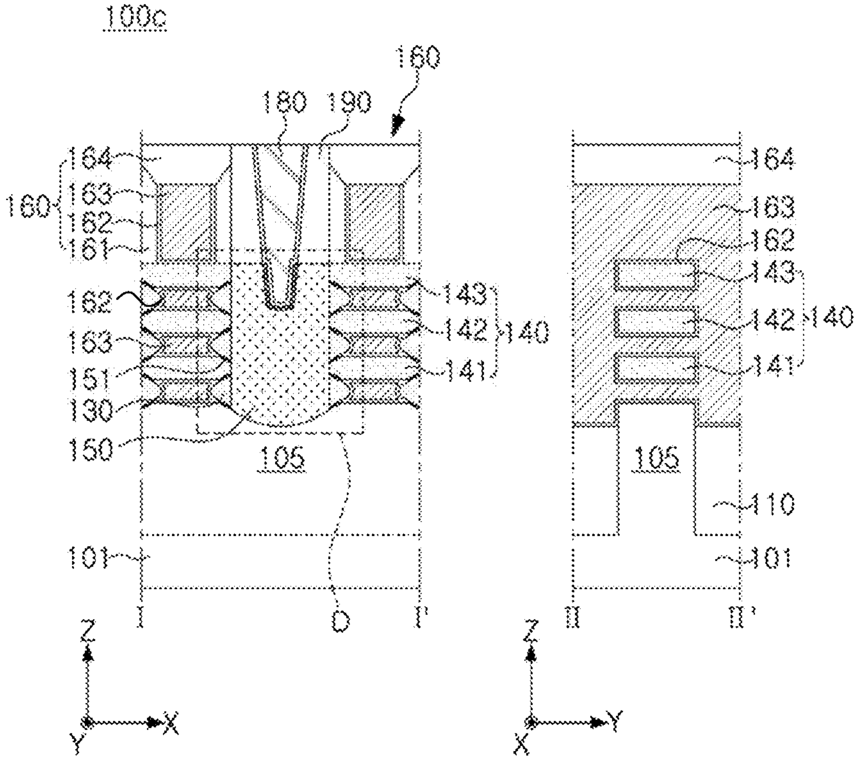
FIG. 5A is a cross-sectional view illustrating a semiconductor device according to example embodiments.

FIG. 5A is a cross-sectional view illustrating a semiconductor device 100*c* according to example embodiments.

Figure 5B:
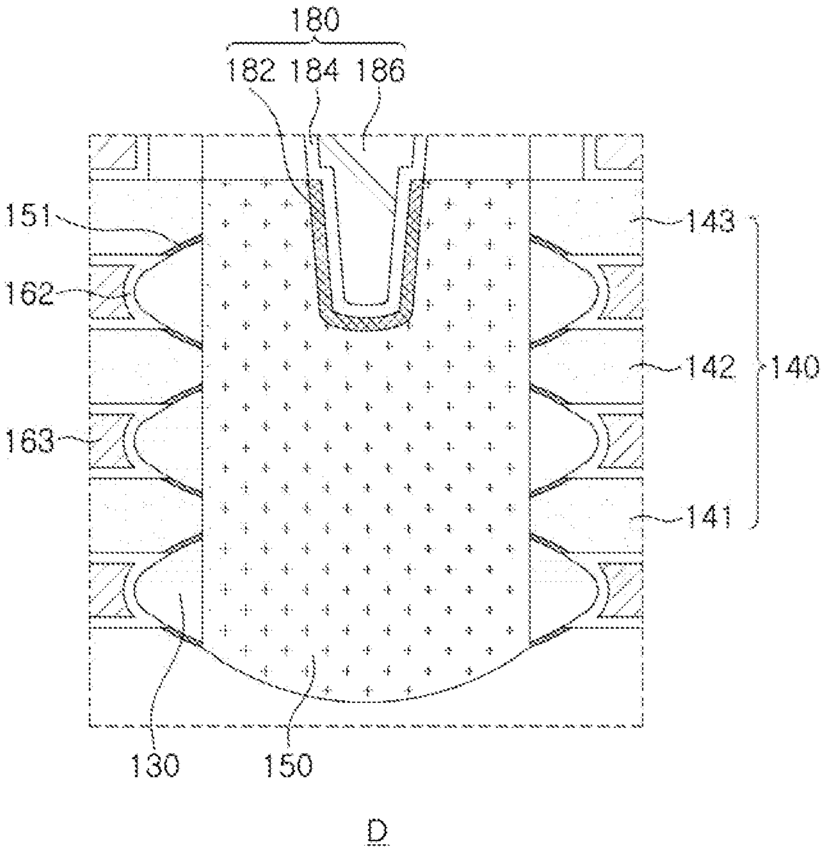
FIG. 5B is a partially enlarged view illustrating a portion of a semiconductor device according to example embodiments.

FIG. 5B is a partially enlarged view illustrating a portion of the semiconductor device 100*c* according to example embodiments. FIG. 5B illustrates an enlarged area 'D' of FIG. 5A.

Referring to FIGS. 5A and 5B, the conductive protective layer 151 may be at boundary portion between the plurality of channel layers 141, 142 and 143 and the inner spacer layers 130 and at a boundary portion of the active region 105 and the inner spacer layers 130. In an implementation, the conductive protective layer 151 may be at boundary portion between the plurality of channel layers 141, 142 and 143 and the inner spacer layers 130, at a boundary portion of the active region 105 and the source/drain region 150, and at a boundary portion between the plurality of channel layers 141, 142, and 143 and the source/drain region 150. When the semiconductor device 100*c* is manufactured, the conductive protective layer 151 may be removed in a process of removing the sacrificial layers 120 (refer to FIG. 9H). In addition, the conductive protective layer 151 at a boundary portion between the active region 105 and the source/drain region 150 and a boundary portion between the plurality of channel layers 141, 142 and 143 and the source/drain region 150 may be removed by a cleaning process and heat treatment before the source/drain region 150 is formed, thereby forming the shape in this manner.

Figure 6A:
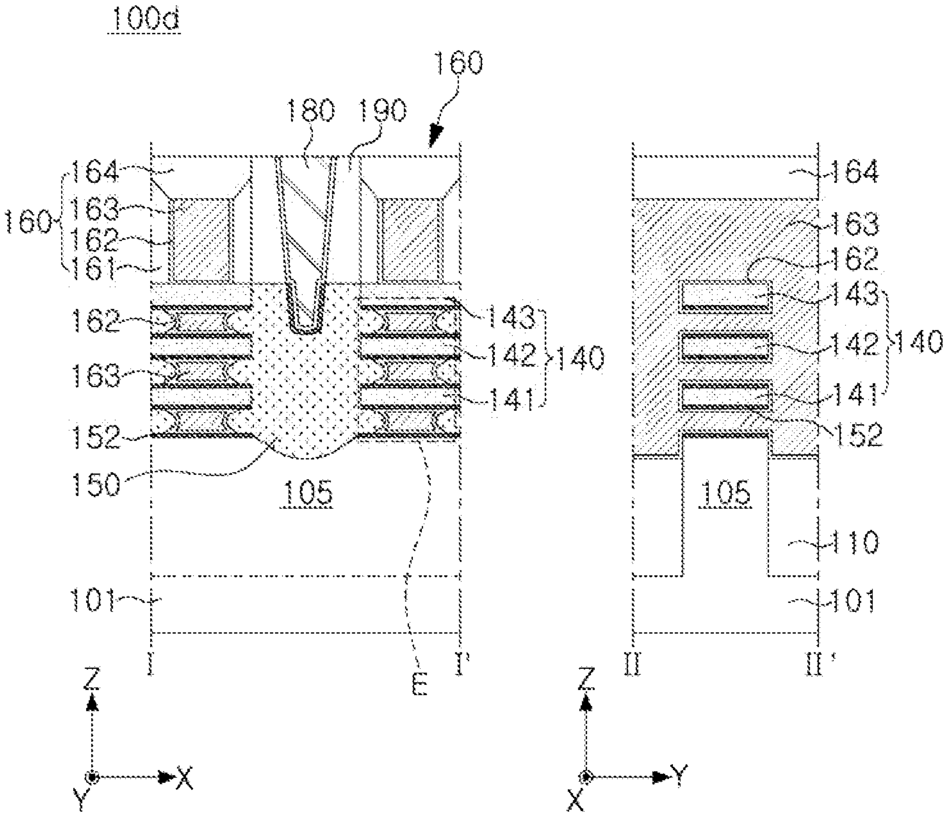
FIG. 6A is a cross-sectional view illustrating a semiconductor device according to example embodiments.

FIG. 6A is a cross-sectional view illustrating a semiconductor device 100*d* according to example embodiments.

Figure 6B:
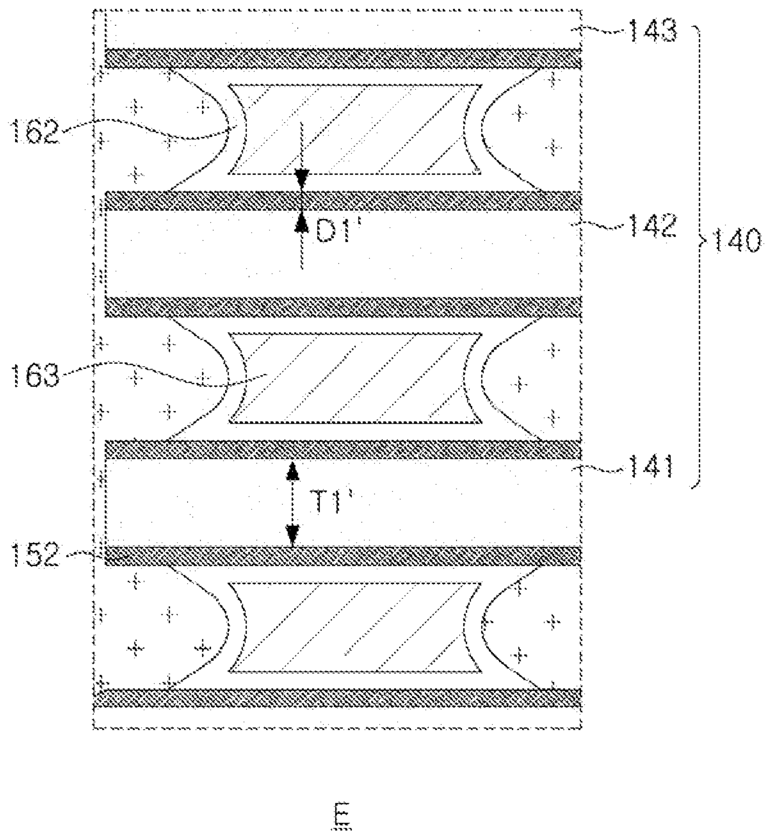
FIG. 6B is a partially enlarged view illustrating a portion of a semiconductor device according to example embodiments.

FIG. 6B is a partially enlarged view illustrating a portion of the semiconductor device 100*d* according to example embodiments. FIG. 6B illustrates an enlarged area 'E' of FIG. 6A.

In an implementation, referring to FIGS. 6A and 6B, unlike the example embodiment of FIG. 2A, the semiconductor device 100*d* may include an insulating protective layer 152 between the active region 105 and the gate structure 160, and between the plurality of channel layers 141, 142 and 143 and the gate structure 160. The insulating protective layer 152 may be formed using a chemical vapor deposition (CVD) process. The insulating protective layer 152 may cover respective lower surfaces of the plurality of channel layers 141, 142, and 143 and may cover an upper surface of a portion of the plurality of channel layers 141, 142, and 143. The insulating protective layer 152 may be formed together in a process of alternately stacking the sacrificial layers 120 and the plurality of channel layers 141, 142, and 143 on the active region 105. In an implementation, the insulating protective layer 152 may help prevent germanium (Ge) from diffusing from the sacrificial layer 120 to the active region 105 and the plurality of channel layers 141, 142, and 143. In an implementation, the insulating protective layer 152 may be at a boundary portion between the plurality of channel layers 141, 142 and 143 and the gate structure 160 and at a boundary portion between the gate structure 160 and the active region 105. In an implementation, the insulating protective layer 152 may be at a boundary portion between the plurality of channel layers 141, 142 and 143 and the gate structure 160, at a boundary portion between the gate structure 160 and the active region 105, and at a boundary portion between the inner spacer layers 130 and the plurality of channel layers 141, 142, and 143. The insulating protective layer 152 may extend substantially horizontally on the upper surface of the active region 105 in the first direction (X).

In an implementation, a thickness D1' (in the Z direction) of the insulating protective layer 152 may be about 0.3 nm to about 1.0 nm. In an implementation, the insulating protective layer 152 may be formed of a two-dimensional material having insulating properties. In an implementation, the insulating protective layer 152 may include, e.g., graphene oxide, hexagonal boron nitride (h-BN), fluorographene BCN, InSe, $MoO_3$, $WO_3$, $TiO_2$, $MnO_2$, $V_2O_5$, or $TaO_3$. In an implementation, the insulating protective layer 152 may include, e.g., hexagonal boron nitride (h-BN), which is a two-dimensional material. The insulating protective layer 152 may help prevent oxidation of the plurality of channel layers 141, 142, and 143 to help protect ends of the plurality of channel layers 141, 142, and 143 from being etched, in the process of forming the recess region RC. In an implementation, the plurality of channel layers 141, 142, and 143 may have a substantially uniform thickness. In an implementation, unlike the example embodiment of FIG. 2A, in the case of a width T1' of the plurality of channel layers 141, 142, and 143 in the vertical Z direction, the thickness may not decrease along or toward the end of the plurality of channel layers 141, 142, and 143. In an implementation, a contact area between the source/drain region 150 and the plurality of channel layers 141, 142, and 143 may be increased, and the resistance between the source/drain region 150 and the plurality of channel layers 141, 142, and 143 may thus be reduced, thereby providing a semiconductor device having improved electrical characteristics.

Figure 7:
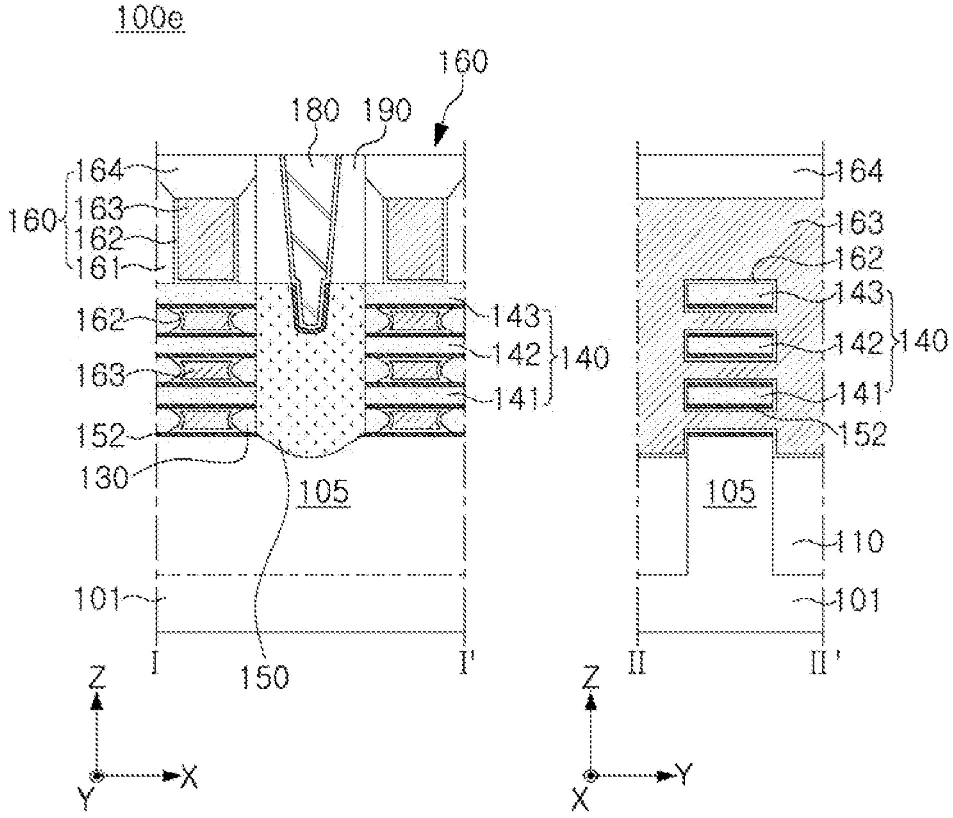
FIG. 7 is a cross-sectional view illustrating a semiconductor device according to example embodiments.

FIG. 7 is a cross-sectional view illustrating a semiconductor device 100e according to example embodiments.

Referring to FIG. 7, unlike the example embodiment of FIG. 6A, the semiconductor device 100e may further include inner spacer layers 130. The inner spacer layers 130 may be on both sides of the gate structure 160 in the first direction (X), and on the respective lower surfaces of the plurality of channel layers 141, 142, and 143, and may have an outer side surface that is substantially coplanar with the outer side surfaces of the plurality of channel layers 141, 142 and 143. The upper and lower surfaces of the inner spacer layers 130 may contact the insulating protective layer 152. In an implementation, a portion of the upper and lower surfaces of the inner spacer layers 130 may be flat. Other descriptions of the inner spacer layers 130 may be the same as those described above with reference to FIGS. 1 to 2B.

Figure 8:
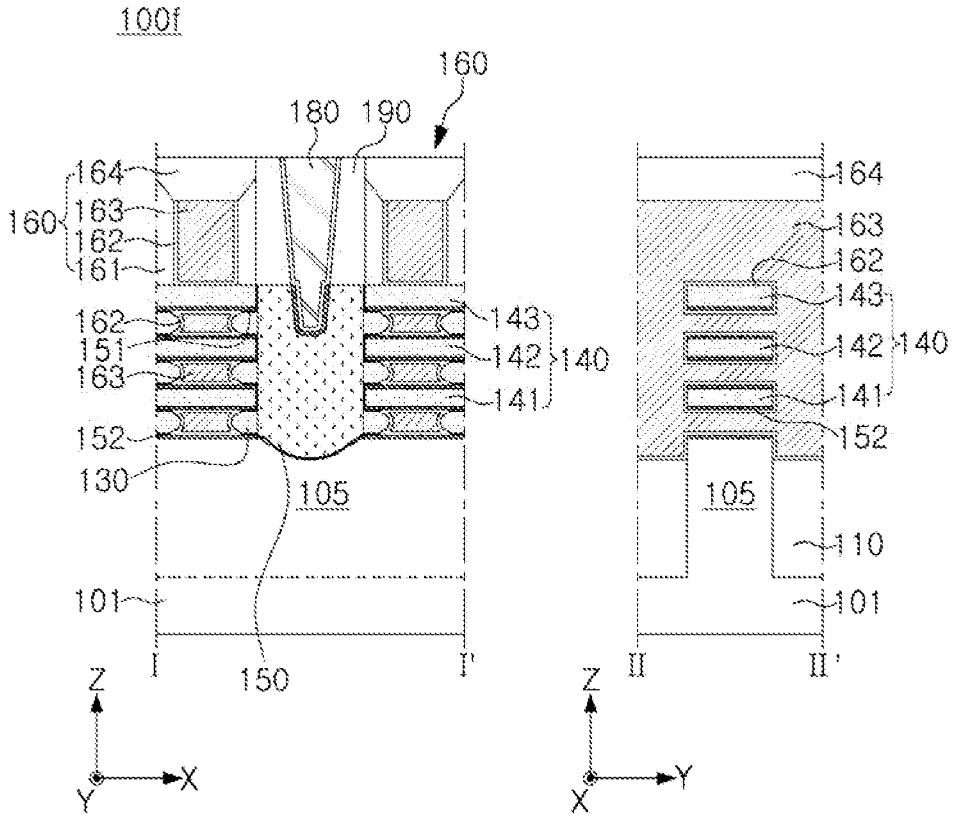
FIG. 8 is a cross-sectional view illustrating a semiconductor device according to example embodiments.

FIG. 8 is a cross-sectional view illustrating a semiconductor device 100f according to example embodiments.

Referring to FIG. 8, the semiconductor device 100f may include both a conductive protective layer 151 and an insulating protective layer 152. The conductive protective layer 151 may contact upper and lower surfaces of the inner spacer layers 130. The conductive protective layer 151 may surround side surfaces of the plurality of channel layers 141, 142, and 143 in the first direction (X). The conductive protective layer 151 and the insulating protective layer 152 may contact upper and lower surfaces of the inner spacer layers 130. The conductive protective layer 151 and the insulating protective layer 152 may contact side surfaces of the plurality of channel layers 141, 142, and 143. In an implementation, as illustrated in FIG. 8, a portion of the conductive protective layer 151 may be in contact with upper and lower surfaces of the inner spacer layers 130. In an implementation, a portion of the conductive protective layer 151 may be between the insulating protective layer 152 and the inner spacer layers 130. In an implementation, a portion of the conductive protective layer 151 may be between the insulating protective layer 152 and the plurality of channel layers 141, 142, and 143. In an implementation, a portion of the conductive protective layer 151 may be between the lowermost insulating protective layer 152 and the active region 105. In an implementation, the conductive protective layer 151 may be between the side surfaces of the plurality of channel layers 141, 142, and 143 and the side surface of the source/drain region 150, and the conductive protective layer 151 may not be on the inner spacer layers 130, the plurality of channel layers 141, 142 and 143, or the upper or lower surfaces of the insulating protective layer 152.

The semiconductor device 100f including the conductive protective layer 151 and the insulating protective layer 152 may be manufactured by performing the same process as in FIGS. 9B to 9J after performing the process of FIG. 10A to be described below.

FIGS. 9A to 9J are cross-sectional views illustrating a stages in a method of manufacturing the semiconductor device 100 according to example embodiments. FIGS. 9A to 9J illustrate an example embodiment of a method of manufacturing the semiconductor device 100 of FIGS. 1 to 2A, and illustrate cross-sections corresponding to FIG. 2A.

Figure 9A:
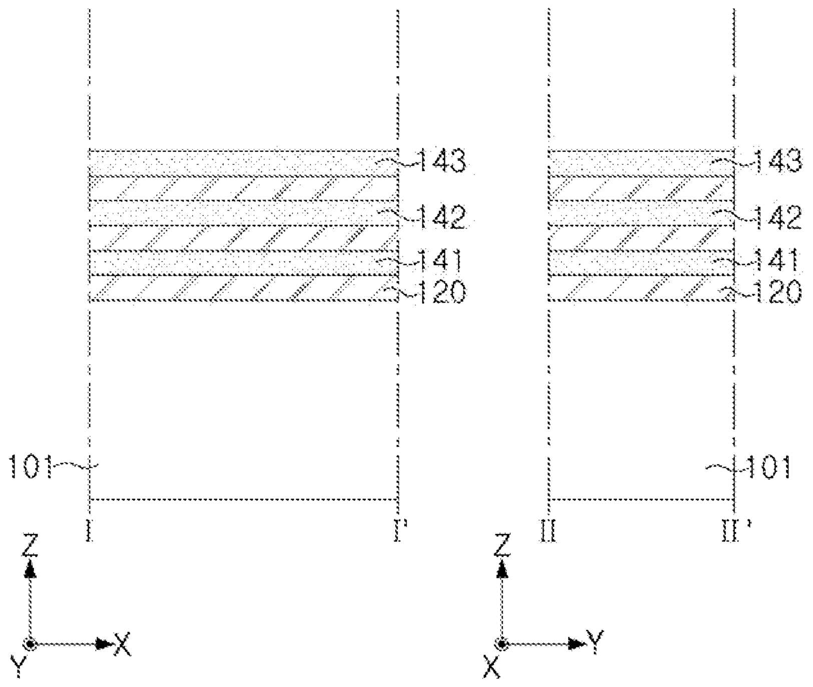
FIGS. 9A to 9J are cross-sectional views illustrating stages in a method of manufacturing a semiconductor device according to example embodiments.

Referring to FIG. 9A, the sacrificial layers 120 and the plurality of channel layers 141, 142, and 143 may be alternately stacked on the active region 105.

The sacrificial layers 120 may be replaced by the gate dielectric layer 162 and the gate electrode layer 163 as illustrated in FIG. 2A through a subsequent process. The sacrificial layers 120 may be formed of a material having etch selectivity with respect to the plurality of channel layers 141, 142, and 143. The plurality of channel layers 141, 142, and 143 may include a material different from a material of the sacrificial layers 120. In an implementation, the plurality of channel layers 141, 142, and 142 may include silicon (Si), and the sacrificial layers 120 may include silicon germanium (SiGe).

The sacrificial layers 120 and the plurality of channel layers 141, 142, and 143 may be formed by performing an epitaxial growth process using the substrate 101 as a seed. Each of the sacrificial layers 120 and the plurality of channel layers 141, 142, and 143 may have a length in a range of about 1 Å to 100 nm. In an implementation, the number of layers of the plurality of channel layers 141, 142, and 143 alternately stacked with the sacrificial layer 120 may be variously changed.

Figure 9B:
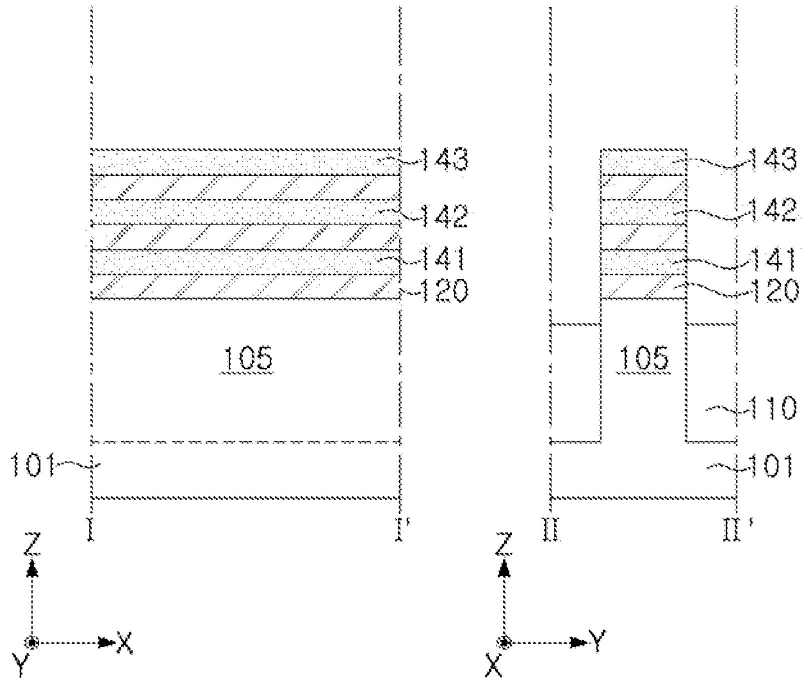

Referring to FIG. 9B, a portion of the substrate 101 and the stacked structure of the sacrificial layers 120 and the plurality of channel layers 141, 142, and 143, and may be removed to form active structures.

The active structure may include sacrificial layers 120 and a plurality of channel layers 141, 142, and 143 that are alternately stacked with each other, and may further include an active region 105 protruding from an upper surface of the substrate 101 by removing a portion of the substrate 101. The active structures may be formed in a line shape extending in one direction, e.g., the X direction, and may be spaced apart from each other in the Y direction.

The device isolation layers 110 may be formed in the region from which a portion of the substrate 101 has been removed by filling the region with the insulating material and then recessing the active region 105 to protrude. An upper surface of the device isolation layers 110 may be formed to be lower than an upper surface of the active region 105.

Figure 9C:
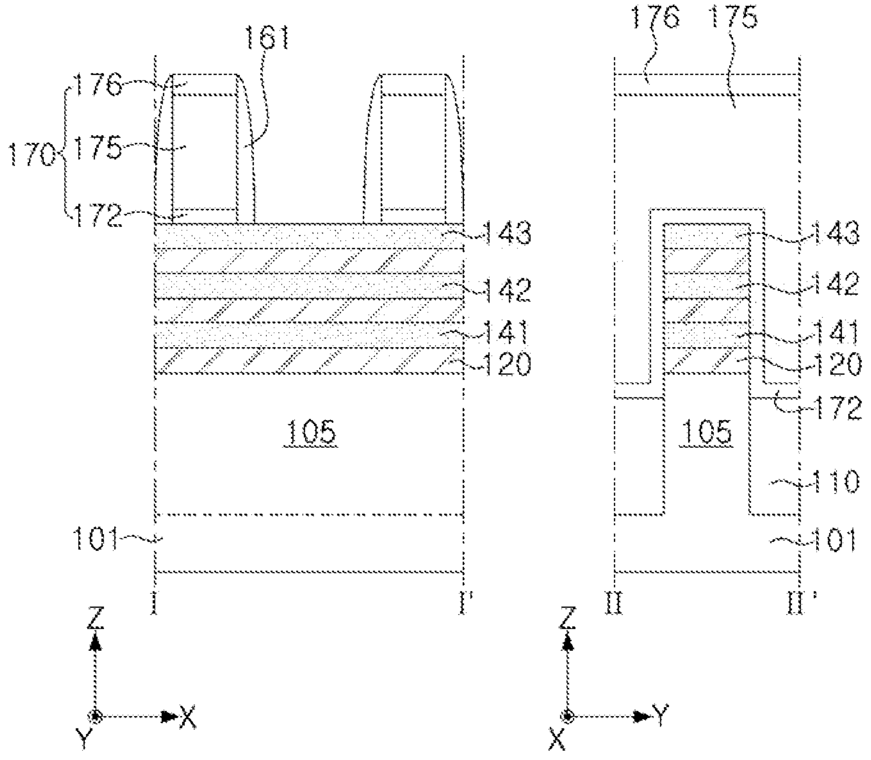

Referring to FIG. 9C, sacrificial gate structures 170 and spacer layers 161 may be formed on the active structures.

The sacrificial gate structures 170 may be sacrificial structures formed in a region in which the gate dielectric layer 162 and the gate electrode layer 163 are disposed, on the channel structure 140, through a subsequent process, as illustrated in FIG. 2. The sacrificial gate structures 170 may include first and second sacrificial gate layers 172 and 175 and a mask pattern layer 176 that are sequentially stacked. The first and second sacrificial gate layers 172 and 175 may be patterned using a mask pattern layer 176. The first and second sacrificial gate layers 172 and 175 may be an insulating layer and a conductive layer, respectively. In an implementation, the first sacrificial gate layer 172 may include silicon oxide, and the second sacrificial gate layer 175 may include polysilicon. The mask pattern layer 176 may include silicon nitride. The sacrificial gate structures 170 may have a line shape that crosses the active structures and extends in one direction. The sacrificial gate structures 170 may extend, e.g., in the Y direction and may be spaced apart from each other in the X direction.

The spacer layers 161 may be formed on both sidewalls of the sacrificial gate structures 170. The spacer layers 161 may be formed by forming a film having a uniform thickness along upper and side surfaces of the sacrificial gate structures 170 and the active structures, and then performing anisotropic etching. The spacer layers 161 may be formed of a low-x material, e.g., SiO, SiN, SiCN, SiOC, SiON, or SiOCN.

Figure 9D:
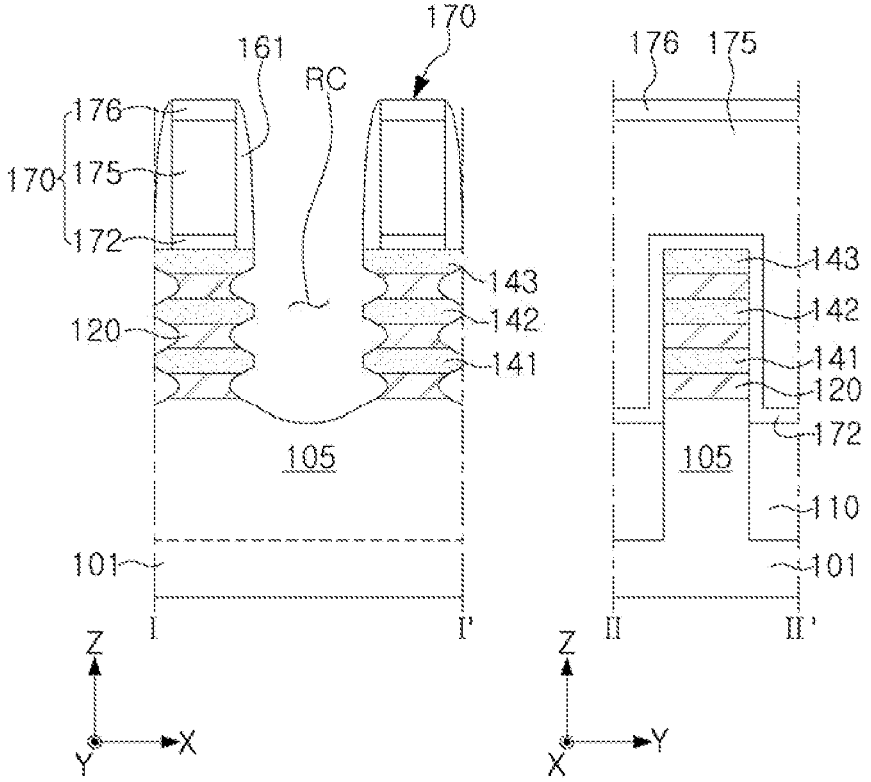

Referring to FIG. 9D, the recess region RC is formed by removing the exposed portions of sacrificial layers 120 and the plurality of channel layers 141, 142, and 143, between the sacrificial gate structures 170, to form the channel structures 140.

The exposed portions of sacrificial layers 120 and the plurality of channel layers 141, 142, and 143 may be removed by using the sacrificial gate structures 170 and the spacer layers 161 as masks. The remaining sacrificial layers 120 may be selectively etched with respect to the channel structures 140 by, e.g., a wet etching process, and may be removed to a predetermined depth from the side surface in the X direction, to have inwardly concave side surfaces. In an implementation, when the remaining sacrificial layers 120 are removed from the side surface in the X direction, a portion of the ends of the channel structures 140 may also be removed. The plurality of remaining channel layers 141, 142, and 143 may have side surfaces etched in the X direction to have outwardly convex sides. In an implementation, the shapes of the side surfaces of the sacrificial layers 120 and the plurality of channel layers 141, 142, and 143 may vary.

Figure 9E:
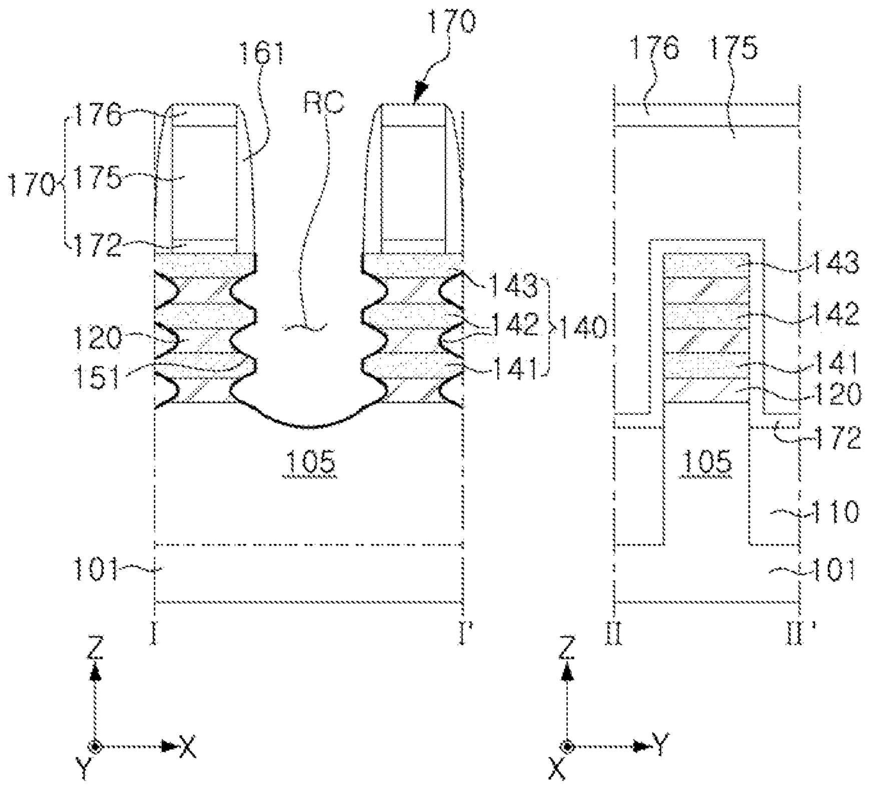

Referring to FIG. 9E, a conductive protective layer 151 may be formed to surround the recess region RC.

The conductive protective layer 151 may be conformally formed between inner side surfaces of the recess region RC. The conductive protective layer 151 may be formed to cover the etched side surfaces of the sacrificial layers 120, side surfaces of the plurality of channel layers 141, 142, and 143, and the exposed upper surface of the active region 105. The conductive protective layer 151 may be formed by a plasma assisted doping (PLAD) process. In an implementation, during the PLAD process, the conductive protective layer 151 containing graphene may be formed using carbon (C), ethylene ($C_2H_4$), or methane ($CH_4$) under the condition that the temperature is about 650° C. to about 1,000° C. In an implementation, the conductive protective layer 151 may be formed of a two-dimensional material having conductivity.

Figure 9F:
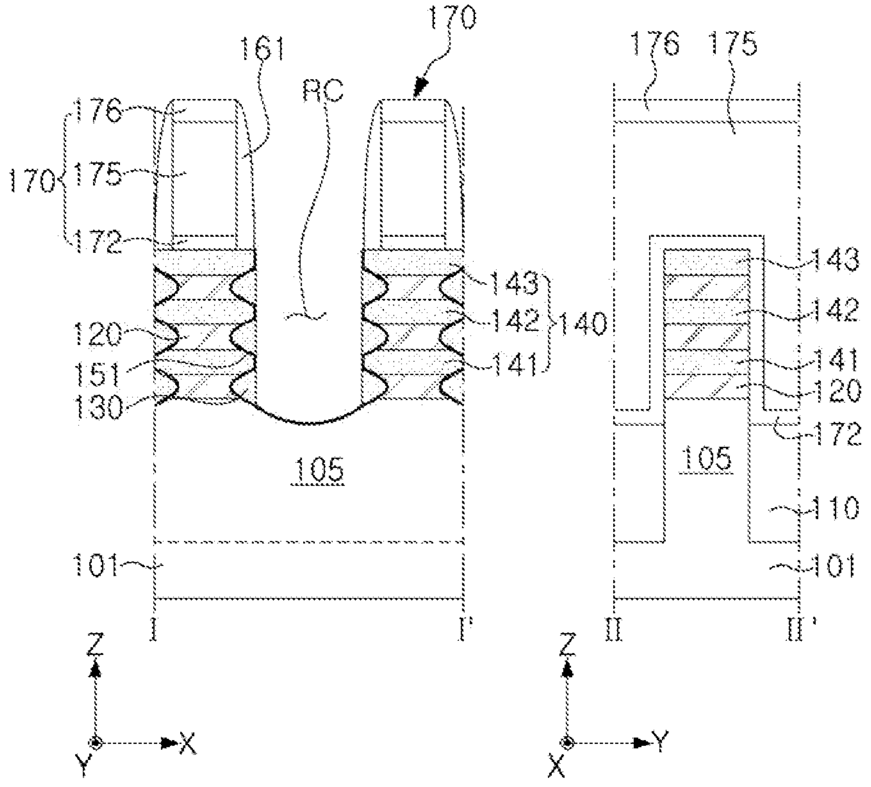

Referring to FIG. 9F, inner spacer layers 130 may be formed.

First, the inner spacer layers 130 may be formed in a region from which the sacrificial layers 120 and the plurality of channel layers 141, 142, and 143 have been removed. The inner spacer layers 130 may be formed by filling an insulating material in a region from which the sacrificial layers 120 and the plurality of channel layers 141, 142, and 143 are removed and removing the insulating material deposited on the outside of the channel structures 140. The inner spacer layers 130 may contact the conductive protective layer 151 in the region in which the sacrificial layers 120 and the plurality of channel layers 141, 142, and 143 have been removed. In an implementation, the inner spacer layers 130 may be formed of the same material as the spacer layers 161. In an implementation, the inner spacer layers 130 may include, e.g., SiN, SiCN, SiOCN, SiBCN, or SiBN.

Figure 9G:
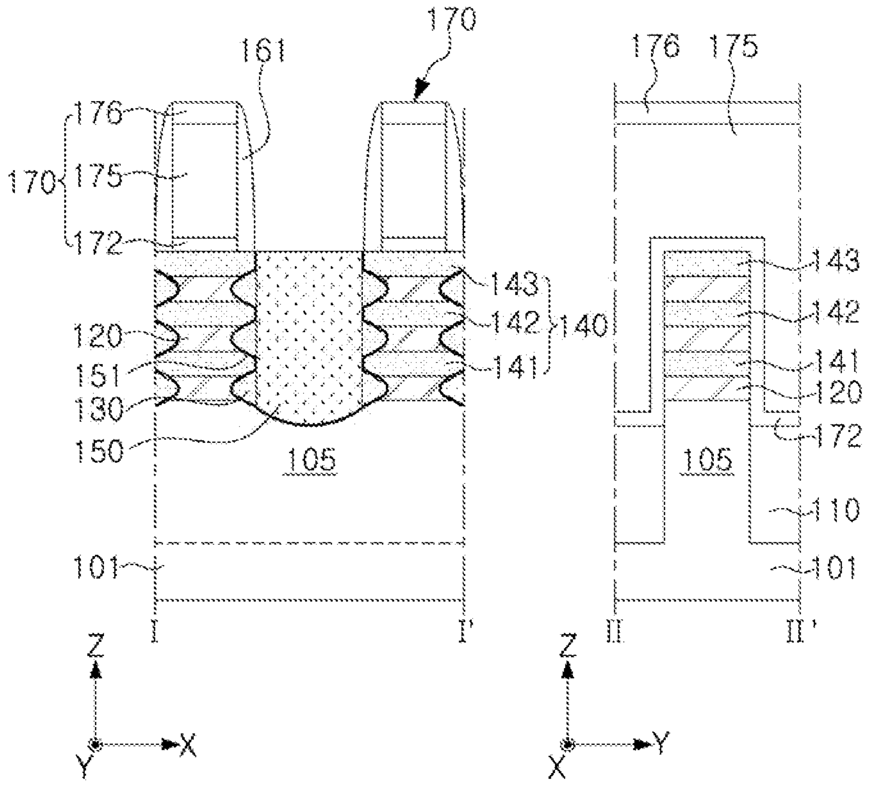

Referring to FIG. 9G, an epitaxial layer of the source/drain region 150 may be formed to fill the recess region RC.

The source/drain region 150 may be formed by an epitaxial growth process. The source/drain region 150 may be formed by repeating epitaxial growth and etching processes, and may extend to contact the conductive protective layer 151 and the inner spacer layers 130 in the recess region RC. A surface of the source/drain region 150 in contact with the inner spacer layers 130 may be formed to form a surface perpendicular to the upper surface of the substrate 101. In an implementation, a surface of the source/drain region 150 facing the plurality of channel layers 141, 142 and 143 and the sacrificial layers 120 may have a wavy shape (See FIG. 6A). The source/drain region 150 may include impurities by in-situ doping. In an implementation, the upper surfaces of the source/drain regions 150 may be located at substantially the same height as or higher than the lower surfaces of the gate structures 160.

Figure 9H:
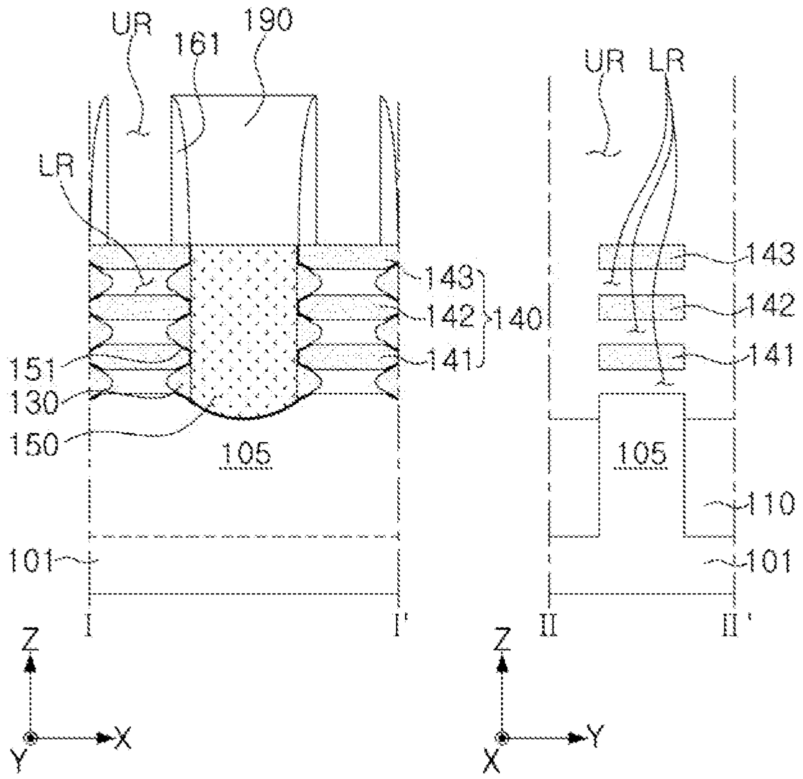

Referring to FIG. 9H, the interlayer insulating layer 190 may be formed, and the sacrificial layers 120 and the sacrificial gate structures 170 may be removed.

The interlayer insulating layer 190 may be formed by forming an insulating layer covering the sacrificial gate structures 170 and the source/drain regions 150 and performing a planarization process.

The sacrificial layers 120 and the sacrificial gate structures 170 may be selectively removed with respect to the spacer layers 161, the interlayer insulating layer 190, and the plurality of channel layers 141, 142, and 143. First, upper gap regions UR may be formed by removing the sacrificial gate structures 170, and then the sacrificial layers 120 exposed through the upper gap regions UR may be removed to form lower gap regions LR. In an implementation, when the sacrificial layers 120 include silicon germanium (SiGe) and the plurality of channel layers 141, 142, and 143 include silicon (Si), the sacrificial layers 120 may be selectively removed by performing a wet etching process using peracetic acid or a solution ($NH_4OH$:$H_2O_2$:$H_2O$=1:1:5) used in the Standard clean-1 (SC1) cleaning process as an etchant. In an implementation, when the conductive protective layer 151 includes graphene, a portion of the conductive protective layer 151 in contact with the sacrificial layer 120 during the removal process may be removed by oxidation with a solution used in the SC1 cleaning process. The source/drain region 150 may be protected by the outermost interlayer insulating layer 190 and the inner spacer layers 130 having a selective etching ratio.

Figure 9I:
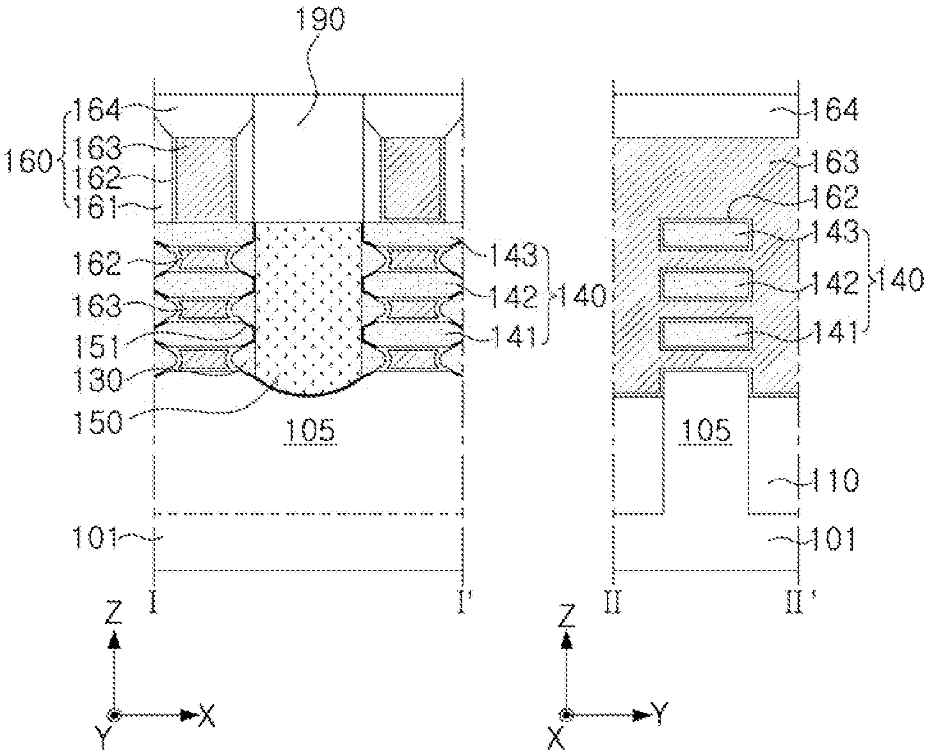

Referring to FIG. 9I, the gate structure 160 may be formed in the upper gap regions UR and the lower gap regions LR.

The gate dielectric layer 162 may be formed to conformally cover inner surfaces of the upper gap regions UR and the lower gap regions LR. The gate electrode layer 163 may be formed to fill the upper gap regions UR and the lower gap regions LR. The gate electrode layer 163 and the spacer layers 161 may be removed to a predetermined depth from the upper portion in the upper gap regions UR. A gate capping layer 164 may be formed in a region in which the gate electrode layer 163 and the spacer layers 161 have been removed from the upper gap regions UR. Accordingly, the gate structure 160 including the gate dielectric layer 162, the gate electrode layer 163, the spacer layers 161, and the gate capping layer 164 may be formed.

Figure 9J:
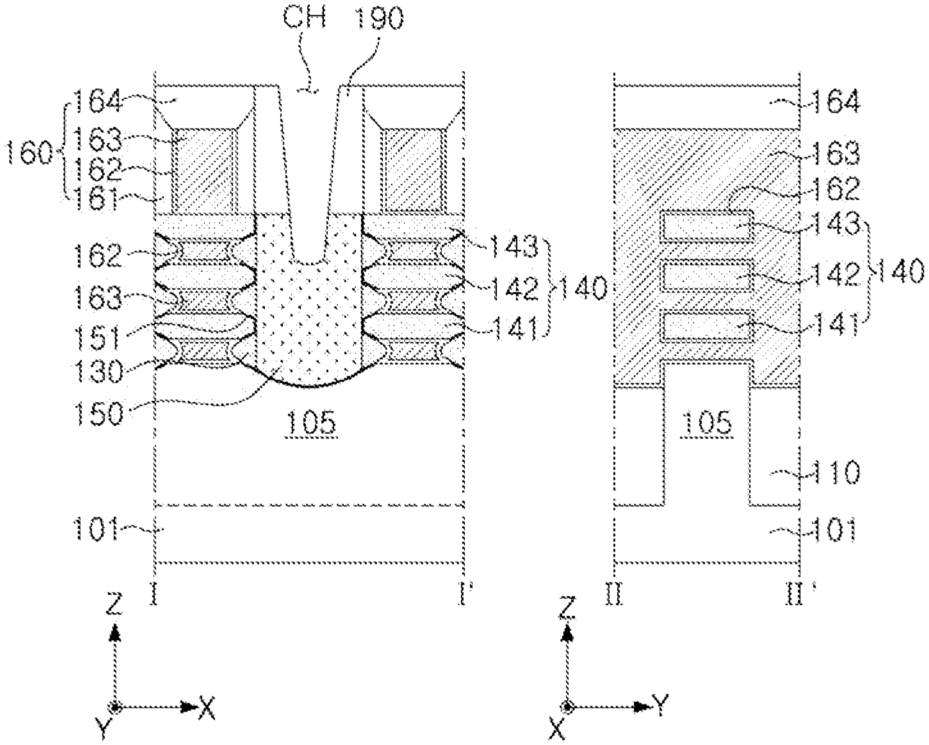

Referring to FIG. 9J, contact holes CH exposing the source/drain region 150 may be formed. Lower surfaces of the contact holes CH may be recessed into the source/drain region 150.

Again, referring to FIGS. 1, 2A, and 2B, the contact plug 180 may be formed in the contact holes CH. The contact plug 180 may include a metal-semiconductor compound layer 182 on a lower end portion, a barrier layer 184 along sidewalls, and a plug conductive layer 186.

In an implementation, the contact plug 180 may pass through at least a portion of the interlayer insulating layer 190 and may contact the source/drain region 150. In an implementation, the metal-semiconductor compound layer 182 of the contact plug 180 may contact a portion of the source/drain region 150, and the lower end of the metal-semiconductor compound layer 182 may be located on a level lower than the upper end of the plurality of channel layers 141, 142 and 143. In an implementation, the shape and arrangement of the contact plug 180 may be variously changed.

Figure 10A:
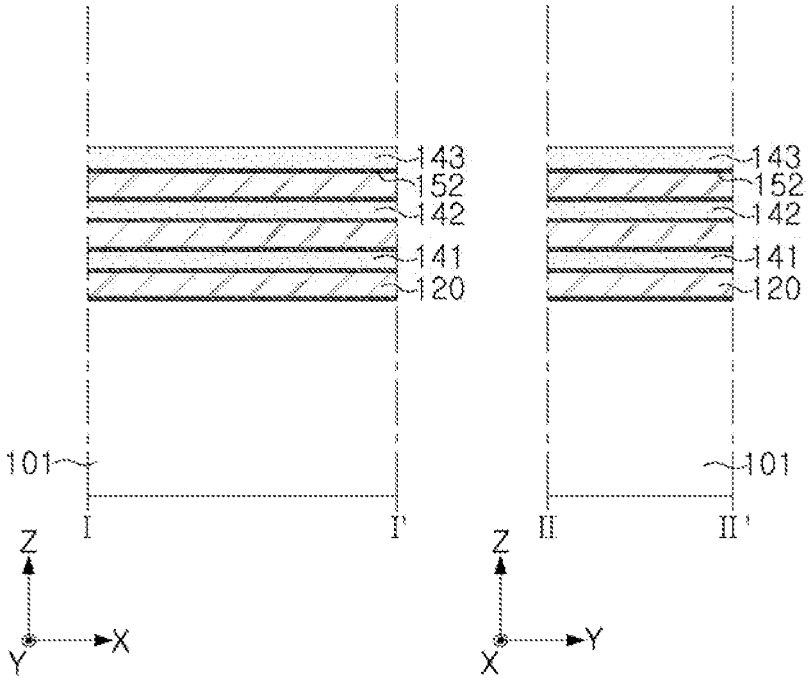
FIGS. 10A to 10C are cross-sectional views illustrating stages in a method of manufacturing a semiconductor device according to example embodiments.
Figure 10B:
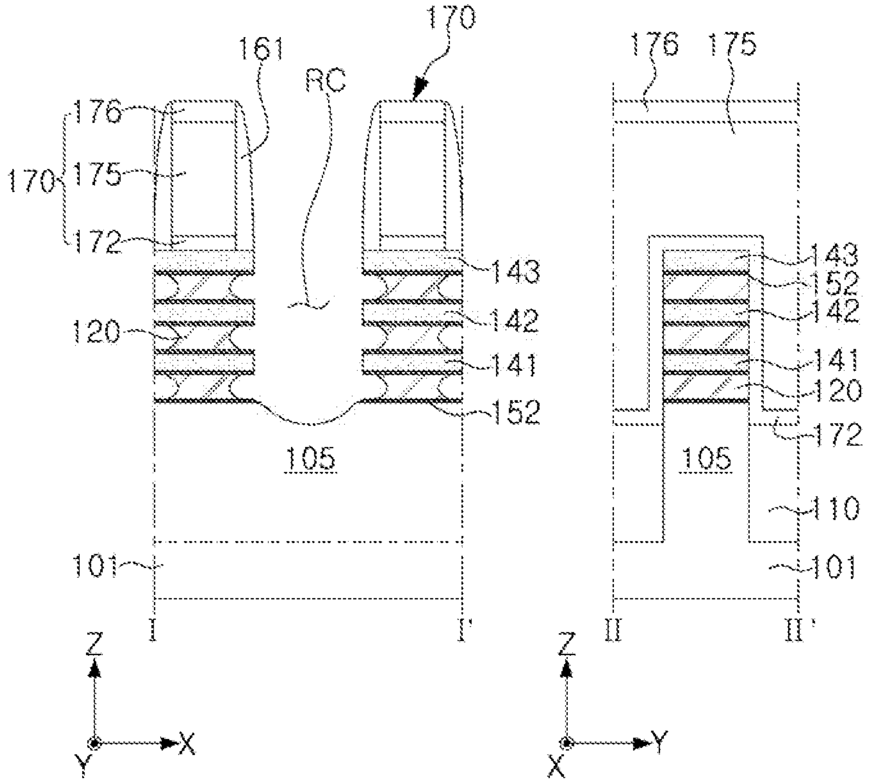
Figure 10C:
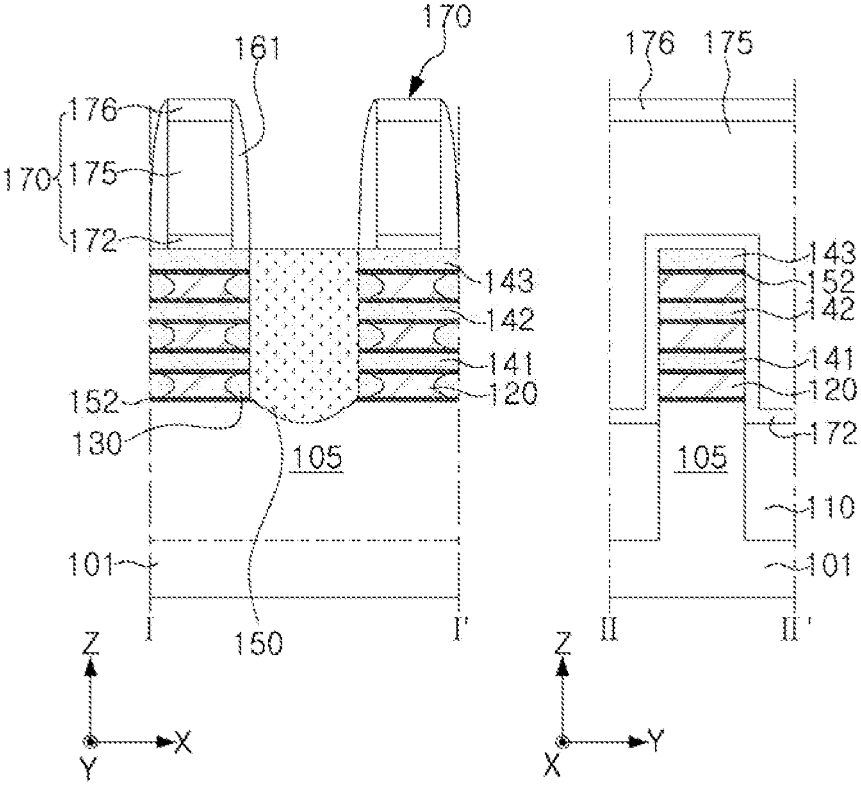

FIGS. 10A to 10C are cross-sectional views illustrating stages in a method of manufacturing the semiconductor device 100*e* according to example embodiments. FIGS. 10A to 10C illustrate an example embodiment of a method of manufacturing the semiconductor device 100*e* of FIG. 7, and illustrate cross-sections corresponding to FIG. 7.

Referring to FIG. 10A, an insulating protective layer 152 may be between the sacrificial layers 120 and the plurality of channel layers 141, 142, and 143, and between the substrate 101 (e.g., the active region 105 to be formed) and a lowermost sacrificial layer 120. The insulating protective layer 152 may be formed using a chemical vapor deposition (CVD) process. First, the insulating protective layer 152 may be formed on the substrate 101. Next, after the sacrificial layer 120 may be formed on the insulating protective layer 152, the insulating protective layer 152 may be formed on the sacrificial layer 120. Next, after a first channel layer 141 is formed on the insulating protective layer 152 formed on the sacrificial layer 120, the insulating protective layer 152 may be formed on the first channel layer 141. Next, the sacrificial layer 120 may be formed again on the insulating protective layer 152 formed on the first channel layer 141. By repeating the above process, the second and third channel layers 142 and 143 may be formed on the insulating protective layer 152 formed on the uppermost sacrificial layer 120 among the sacrificial layers 120.

Next, the same process as those of FIGS. 9B and 9C described above may be performed.

Referring to FIG. 10B, the recess region RC may be formed by removing the exposed portions of the sacrificial layers 120 and the plurality of channel layers 141, 142, and 143, between the sacrificial gate structures 170, thereby forming the channel structures 140.

When the same process as the process of FIG. 9D is performed, the remaining sacrificial layers 120 may be removed from the side surface in the X direction. In this case, unlike some of the ends of the channel structures 140 being removed, the channel structures 140 may be protected by the insulating protective layer 152, and therefore, a portion of the ends of the channel structures 140 may not be removed. In an implementation, the plurality of channel layers 141, 142, and 143 may be formed to have a uniform thickness (e.g., across an entire width or length thereof).

Next, the same process as those of FIGS. 9E and 9F described above may be performed.

Referring to FIG. 10C, an epitaxial layer of the source/drain region 150 may be formed to fill the recess region RC.

The same process as the process of FIG. 9G described above may be performed. During the process of FIG. 10B, the thicknesses of the plurality of channel layers 141, 142 and 143 in the vertical direction may be uniformly formed, and a contact surface between the source/drain region 150 and the plurality of channel layers 141, 142, and 143 may be increased.

Next, the process of forming the contact plug 180 may be performed after the same process as in FIGS. 9H to 9J is performed, and therefore, the semiconductor device 100*e* illustrated in FIG. 7 may be manufactured.

As set forth above, the resistance between the plurality of channel layers and the source/drain region may be reduced by the structure including a protective layer including a two-dimensional material before the source/drain region is formed. Accordingly, a semiconductor device having improved electrical characteristics may be provided.

One or more embodiments may provide a semiconductor device having improved electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:

a substrate;

an active region extending in a first direction on the substrate;

a plurality of channel layers on the active region, the plurality of channel layers being spaced apart from each other in a vertical direction that is perpendicular to the first direction;

a gate structure on the substrate, the gate structure intersecting the active region and the plurality of channel layers, extending in a second direction crossing the first direction, and respectively surrounding the plurality of channel layers;

inner spacer layers on both sides of the gate structure in the first direction, and on respective lower surfaces of the plurality of channel layers;

protective layers in contact with the inner spacer layers, the plurality of channel layers, and the active region; and a source/drain region on the active region, on at least one side of the gate structure, and in contact with the inner spacer layers, wherein the protective layers are spaced apart from each other in the vertical direction, and wherein at least one of the protective layers is disposed between one of the plurality of channel layers and an adjacent inner spacer layer among the inner spacer layers.

2. The semiconductor device as claimed in claim 1, wherein the protective layers include a two-dimensional material.

3. The semiconductor device as claimed in claim 2, wherein the two- dimensional material includes graphene or hexagonal boron nitride.

4. The semiconductor device as claimed in claim 1, wherein a thickness of each of the protective layers is about 0.3 nm to about 1.0 nm.

5. The semiconductor device as claimed in claim 1, wherein the protective layers include a conductive material.

6. The semiconductor device as claimed in claim 5, wherein the protective layers are at:

a boundary portion between the plurality of channel layers and the inner spacer layers;

a boundary portion between the active region and the source/drain region; and a boundary portion between the plurality of channel layers and the source/drain region.

7. The semiconductor device as claimed in claim 5, wherein the protective layers surround a portion of the source/drain region.

8. The semiconductor device as claimed in claim 5, wherein a thickness of the plurality of channel layers in the vertical direction decreases toward the source/drain region in the first direction.

9. The semiconductor device as claimed in claim 1, wherein a lowermost portion of a lowermost protective layer among the protective layers is on a level lower than a lowermost level of the gate structure in the first direction.

10. The semiconductor device as claimed in claim 1, wherein the protective layers include an insulating material.

11. The semiconductor device as claimed in claim 10, wherein each of the protective layers extends substantially in the first direction.

12. The semiconductor device as claimed in claim 10, wherein the protective layers are at:

a boundary portion between the plurality of channel layers and the gate structure;

a boundary portion between the gate structure and the active region; and a boundary portion between the inner spacer layers and the plurality of channel layers.

13. The semiconductor device as claimed in claim 1, further comprising a contact plug connected to the source/drain region, wherein the contact plug includes a metal-semiconductor compound layer.

14. A semiconductor device, comprising:

a substrate;

an active region extending in a first direction on the substrate;

a plurality of channel layers on the active region, the plurality of channel layers being spaced apart from each other in a vertical direction that is perpendicular to the first direction;

a gate structure on the substrate, the gate structure intersecting the active region and the plurality of channel layers, extending in a second direction that crosses the first direction, and surrounding the plurality of channel layers, respectively;

inner spacer layers on both sides of the gate structure in the first direction, and on respective lower surfaces of the plurality of channel layers;

conductive protective layers in contact with the inner spacer layers and the plurality of channel layers; and a source/drain region on the active region, on at least one side of the gate structure, and in contact with the inner spacer layers, wherein the conductive protective layers are between the plurality of channel layers and the source/drain region, and wherein the conductive protective layers include a conductive material.

15. The semiconductor device as claimed in claim 14, wherein the conductive protective layers include a two-dimensional material.

16. The semiconductor device as claimed in claim 14, wherein the conductive protective layers surround an outer side surface and a lower surface of a region formed of the inner spacer layers and the source/drain region.

17. The semiconductor device as claimed in claim 14, wherein the conductive protective layers surround an outer side surface of the inner spacer layers facing the gate structure.

18. The semiconductor device as claimed in claim 14, wherein the conductive protective layers are at:

a boundary portion between the inner spacer layers and the plurality of channel layers; and a boundary portion between the inner spacer layers and the active region.

19. A semiconductor device, comprising:

a substrate;

an active region extending in a first direction on the substrate;

a plurality of channel layers on the active region, the plurality of channel layers being spaced apart from each other in a vertical direction that is perpendicular to the first direction;

a gate structure on the substrate, the gate structure extending in a second direction that crosses the first direction, intersecting the active region and the plurality of channel layers, and respectively surrounding the plurality of channel layers;

insulating protective layers between the plurality of channel layers and the gate structure and between the active region and the plurality of channel layers, wherein the insulating protective layers are spaced apart from each other in the vertical direction; and a source/drain region on the active region on at least one side of the gate structure, and in contact with the plurality of channel layers, wherein the insulating protective layers cover respective lower surfaces of the plurality of channel layers, cover an upper surface of a portion of the plurality of channel layers, and are in contact with the source/drain region.

20. The semiconductor device as claimed in claim 19, further comprising inner spacer layers on both sides of the gate structure in the first direction, on the respective lower surfaces of the plurality of channel layers, and in contact with the insulating protective layers, wherein at least one of the insulating protective layers is disposed between one of the plurality of channel layers and an adjacent inner spacer layer among the inner spacer layers.

* * * * *